(12) United States Patent
Gloss et al.

(10) Patent No.: US 9,426,044 B2
(45) Date of Patent: Aug. 23, 2016

(54) RADIO ACCESS NETWORK GEOGRAPHIC INFORMATION SYSTEM WITH MULTIPLE FORMAT

(71) Applicant: Alcatel Lucent, Paris (FR)

(72) Inventors: Bernd Gloss, Stuttgart (DE); Jens Gebert, Oberstenfeld (DE)

(73) Assignee: Alcatel Lucent, Boulogne-Billancourt (FR)

( * ) Notice: Subject to any disclaimer, the term of this patent is extended or adjusted under 35 U.S.C. 154(b) by 74 days.

(21) Appl. No.: 14/256,406

(22) Filed: Apr. 18, 2014

(65) Prior Publication Data

US 2015/0304180 A1    Oct. 22, 2015

(51) Int. Cl.
*H04L 12/26*    (2006.01)
*H04W 4/02*    (2009.01)

(52) U.S. Cl.
CPC ............. *H04L 43/045* (2013.01); *H04W 4/021* (2013.01); *H04W 4/027* (2013.01)

(58) Field of Classification Search
CPC ..... H04W 16/00; H04W 16/18; H04W 24/02; H04W 16/22; H04W 24/08; H04B 17/15; H04B 17/18; H04B 17/336; H04B 17/345; H04B 17/391; H04B 17/3912; H04L 43/00; H04L 43/04; H04L 43/045; H04L 43/06; H04L 43/062
See application file for complete search history.

(56) References Cited

U.S. PATENT DOCUMENTS

| 6,571,279 | B1 * | 5/2003 | Herz | ................ | G06F 17/30867 |
| | | | | | 707/999.01 |
| 7,272,405 | B2 | 9/2007 | Maillard | | |
| 2003/0131073 | A1 * | 7/2003 | Lucovsky | ............. | G06F 21/335 |
| | | | | | 709/219 |
| 2006/0083181 | A1 * | 4/2006 | Gebert et al. | ................. | 370/254 |
| 2009/0144293 | A1 * | 6/2009 | Chowdhury | .................. | 707/100 |
| 2010/0315289 | A1 | 12/2010 | Nurmela et al. | | |
| 2014/0297667 | A1 * | 10/2014 | Lawson | ....................... | 707/755 |

FOREIGN PATENT DOCUMENTS

EP    2670186    4/2013

OTHER PUBLICATIONS

3rd Generation Partnership Project; Technical Specification Group Radio Access Network; Evolved Universal Terrestrial Radio Access (E-UTRA); Radio Resource Control (RRC); Protocol specification (Release 11). Technical Report 3GPP TS 36.331 V11.2.0, 3GPP, Dec. 2012.

3rd Generation Partnership Project; Technical Specification Group Radio Access Network; Evolved Universal Terrestrial Radio Access Network (E-UTRAN); X2 application protocol (X2AP) (Release 10). Technical Report 3GPP TS 36.423 V10.4.0, 3GPP, Dec. 2011.

(Continued)

*Primary Examiner* — Scott M Sciacca
(74) *Attorney, Agent, or Firm* — Kramer & Amado, P.C.

(57) ABSTRACT

Various exemplary embodiments relate to a method and server for processing geo-information including receiving, at the Geo-Information System server, a geo-view identifier; sending an indication whether a geo-view identified by the geo-view identifier is available, the geo-view comprising a schema identifier, wherein a schema identified by the schema identifier describes a data format comprising location information and one or more characteristics of the conditions in the cellular network; receiving data in a format consistent with the identified schema; and storing the received data in a data store.

12 Claims, 5 Drawing Sheets

(56) References Cited

OTHER PUBLICATIONS

3rd Generation Partnership Project; Technical Specification Group Radio Access Network; Universal Terrestrial Radio Access (UTRA) and Evolved Universal Terrestrial Radio Access (E-UTRA); Radio measurement collection for Minimization of Drive Tests (MDT); Overall description; Stage 2 (Release 11). Technical Report 3GPP TS 37.320 V11 2.0, 3GPP, Dec. 2012.

Antonio Capone, Ilario Filippini, Bernd Gloss, and Ulrich Barth. Rethinking Cellular System Architecture for Breaking Current Energy Efficiency Limits. In the Second IFIP Conference on Sustainable Internet and ICT for Sustainability, Pisa, Italy, Oct. 4-5, 2012.

Bernd Gloss. Network Analysis for Radio Resource Activation in Green Mobile Networks, 2012. EP12305613.7.

D. Tipper, A. Rezgui, P. Krishnamurthy, and P. Pacharintanakul. Dimming Cellular Networks. In GLOBECOM 2010, 2010 IEEE Global Telecommunications Conference, Miami, Florida, US, Dec. 6-10, 2010.

Edgar Kühn, Harald Eckhardt. Outage compensating configuration preset. 810412-EP-EPA.

Rouzbeh Razavi, Siegfried Klein, and Holger Claussen. A fuzzy reinforcement learning approach for self-optimization of coverage in LTE networks. Bell Labs Technical Journal, 15(3):153-176, Dec. 2010.

Katerina Dufková, Milan Bjelica, Byongkwon Moon, Lukas Kencl, and Jean-Yves Le Boudec. Energy Savings for Cellular Network with Evaluation of Impact on Data Traffic Performance. In European Wireless 2010, Lucca, Italy, Apr. 12-15, 2010.

Michaela Neuland; Influence of Different Factors on X-map Estimation in LTE; IEEE 73rd Vehicular Technology Conference (VTC 2011—Spring); May 2011.

* cited by examiner

AREA DATA REQUESTS

RADIO ACCESS NETWORK GEOGRAPHIC INFORMATION SYSTEM WITH MULTIPLE FORMAT

CROSS-REFERENCE TO RELATED APPLICATIONS

This application is related to co-pending application U.S. application Ser. No. 14/256,320 filed on Apr. 18, 2014, "X-MAPS WITH FLEXIBLE TILES," which is hereby incorporated by reference for all purposes as if fully set forth herein. This application is related to PCT patent application Ser. No. EP 2670186, filed on Jun. 1, 2012, which is hereby incorporated by reference for all purposes as if fully set forth herein.

TECHNICAL FIELD

Various exemplary embodiments disclosed herein relate generally to a method and apparatus for generating and disseminating information useful for determining or predicting wireless or cellular network conditions at physical locations.

BACKGROUND

Optimizing the performance of communications networks, particularly cellular networks, is complicated by the complex interaction of the transmission and receiving capabilities of physical equipment with static, semi-static and dynamic changes of spatial radio propagation conditions that result from real-world effects of buildings, moving objects, and increased or decreased demand over time. Real-world influences include slow and fast changing shading and reflecting objects in the radio path, for example, buildings, trees, and moving objects (e.g. cars, trucks); as well as changes in broadcast density based on user demand and flow, for example, the movement of users into and out of residential and commercial districts depending on time of day. These external factors influence multi-path radio conditions and can result in vague radio path conditions between two points, including, for example, fading.

Although some PHY-layer (network and communications hardware) and MAC-layer (media access control) technologies are able to mitigate some of the worst radio path properties, e.g., reducing high frequency selectivity of radio paths by evaluating pilot symbols and scheduling around short-term and shortest-term propagation conditions (for example, fast changing (dynamic) effects such as, e.g., fast-fading, slow-fading due to environment changes, and highly dynamic properties, such as moving cars) at the MAC layer, optimization of network performance can be enhanced if there is increased information about the static and semi-static spatial radio propagation conditions in a given area and their effect on network efficiency.

The expansion of the smartphone and tablet markets has led to an explosion of Location-Based Services (LBS), including services to identify the location of a person or object, sometimes in relation to a specific location (e.g. an ATM machine or another user), based on the location of a transmitting device located on or near the person or object. Positioning systems designed to support such services have developed at a rapid pace, with developments focused on increasing the reliability of the location data collected from and reported to a device. These developments have benefitted data consumers of user location information by improving location data such as the accuracy of map positions reported to a user of location based services. Although these services are highly useful for user-level applications related to locating specific devices in near real-time, they lack capabilities useful for smart network management functions.

For example, network operators and others may find it desirable to track spatially resolved actual radio propagation conditions in deployed networks.

SUMMARY

In light of the present need for an adaptable system linking geographic information with information about wireless network conditions, a brief summary of various exemplary embodiments is presented. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in later sections.

Various exemplary embodiments relate to a method performed by a Geo-Information System server for processing geo-information related to conditions in a cellular network, the method including one or more of receiving, at the Geo-Information System server, a geo-view identifier; sending an indication whether a geo-view identified by the geo-view identifier is available, the geo-view comprising a schema identifier, wherein a schema identified by the schema identifier describes a data format comprising location information and one or more characteristics of the conditions in the cellular network; receiving data in a format consistent with the identified schema; and storing the received data in a data store. In various alternative embodiments, the characteristics of the conditions in the cellular network include one or more of radio propagation models, x-maps, geometric shapes specifying Signal-to-Interference-plus-Noise Ratio (SINR) contour lines, spatial extent of shading objects, and terrain contour lines. In another embodiment of the invention, the location information includes data elements representing one of a group consisting of physical position, estimated accuracy, method of detection, speed, bearing, and estimated distance to a fixed point.

In some embodiments, a geo-view includes data elements representing one of a group consisting of path loss from antennas, locations of antennas, and radio propagation properties. In some further embodiments, the method includes, when the geo-view identifier is not available, receiving schema information for a new geo-view, the schema information comprising a schema identifier and data format information; generating an identifier for the new geo-view; storing the identifier for the new geo-view; and sending the identifier for the new geo-view. In some further embodiments, the identifier for the new geo-view is identical to the received geo-view identifier.

Various exemplary embodiments relate to a Geo-Information System server for processing geo-information related to conditions in a cellular network, the Geo-Information System server including a network interface and a processor in communication with the network interface, the processor being configured to receive, via the network interface, a geo-view identifier; send, via the network interface, an indication whether a geo-view identified by the geo-view identifier is available, the geo-view comprising a schema identifier, wherein a schema identified by the schema identifier describes a data format comprising location information and one or more characteristics of the conditions in the cellular network; receive, via the network interface, data in a format consistent with the identified schema; and store the received data in a data store. In various alternative embodiments, the characteristics of the conditions in the cellular network include one or more of radio propagation models, x-maps, geometric shapes specifying Signal-to-Interference-plus-Noise Ratio (SINR) contour lines, spatial extent of shading objects, and terrain contour lines. In some embodiments, the location information include data elements representing one of a group consisting of physical position, estimated accuracy, method of detection, speed, bearing, and estimated distance to a fixed point.

In another embodiment of the invention, a geo-view includes data elements representing one of a group consisting of path loss from antennas, locations of antennas, and radio propagation properties. In some additional embodiments, the processor is further configured to receive, via the network interface, a query comprising a location indication; and wherein the sent data comprises one or more characteristics of the conditions in the cellular network and location information consistent with the location indication. In some alternative embodiments, the processor is further configured to receive, via the network interface, a query comprising a location indication; and wherein the sent data comprises an indication that there is no stored data consistent with the location indication. In some embodiments of the invention, the characteristics of the conditions in the cellular network include one or more of radio propagation models, x-maps, geometric shapes specifying Signal-to-Interference-plus-Noise Ratio (SINR) contour lines, spatial extent of shading objects, terrain contour lines, and individual path measurements.

BRIEF DESCRIPTION OF THE DRAWINGS

In order to better understand various exemplary embodiments, reference is made to the accompanying drawings, wherein.

DETAILED DESCRIPTION

The description and drawings presented herein illustrate various principles. It will be appreciated that those skilled in the art will be able to devise various arrangements that, although not explicitly described or shown herein, embody these principles and are included within the scope of this disclosure. As used herein, the term, "or," as used herein, refers to a non-exclusive or (i.e., and/or), unless otherwise indicated (e.g., "or else" or "or in the alternative"). Additionally, the various embodiments described herein are not necessarily mutually exclusive and may be combined to produce additional embodiments that incorporate the principles described herein. Further, while various exemplary embodiments are described with regard to a Geo-Information Service, it will be understood that the techniques and arrangements described herein may be implemented to facilitate network optimization in light of environmental properties in other types of systems that implement multiple types of data processing or data structure.

Network operators and others may find it desirable to track spatially resolved actual radio propagation conditions in deployed networks. Having such information can allow, for example, an improvement in network performance by automatically accounting for geographical relationships among cells and between sender and receiver antennas when optimizing network parameters. Improved information about real radio propagation conditions can enable practical applications as described below, such as aiding in network re-planning to improve service quality and network capacity in already-deployed networks by optimizing the parameters of existing equipment, facilitating opportunistic communications on a user device, or supplying an application with geo-views for population density distribution for the calculation of foot and vehicular traffic flow.

In view of the foregoing, it would be desirable to create an information base for "Geo-aware Self-Optimizing Networks" (Geo-SON or geo-aware SON) by gathering and storing static and semi-static data about environmental properties from measurements and from log data stemming from cellular networks, in a form useful for network management functions. A Geo-information System (GIS) maintains a data store of geo-views useful for determining or predicting network conditions at physical locations. Examples of such geo-views are spatially resolved radio coverage, spatially resolved radio path conditions, radio path properties, spatial relationships among cells, terrain information, building shapes, network demand, and other objects in the physical environment or environmental properties that have a major influence on radio propagation conditions in a cellular access network. In particular, it would be desirable to introduce geographic awareness for smart management of wireless networks such as cellular access networks.

Referring now to the drawings, in which like numerals refer to like components or steps, there are disclosed broad aspects of various exemplary embodiments.

Figure 1:
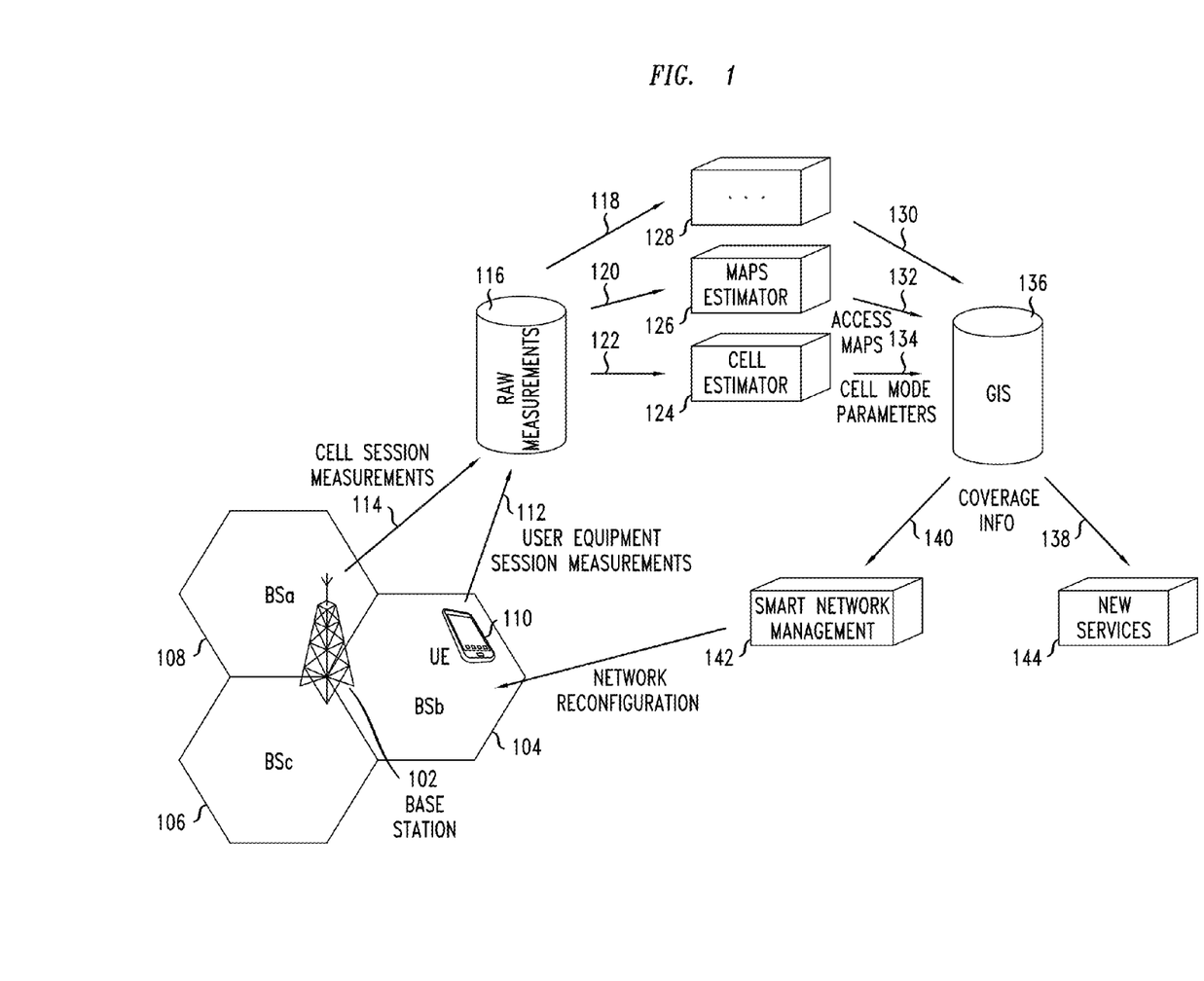
FIG. 1 illustrates an exemplary environment for a Geo-Information Service.

Various components of the Geographic Information System and elements for data collection, retention, processing, distribution, and related components are shown in FIG. 1. The GIS includes system architecture for network internal generation, management, storage in the GIS service or store, and use of spatially resolved data. In addition to the GIS, the architecture includes the functions of data gathering, generation of relevant geo-information from raw measurements, and use of the geo-information such as spatially resolved data. Geo-information may be used in geo-aware network management functions and other geo-aware functions including service optimization and user services.

Data is initially acquired from one or more user equipment devices 110 and/or network devices such as base stations (BS) 102, and processed into views as discussed below. Although the term "cell" is typically used interchangeably with BS 102, BS 102 have two or more different sectors (BSa 108, BSb 104, and BSc 106), each of which would be recognized as a different cell. Data is acquired when measurements are taken which may be sole measurement events, or may be multiple events processed on a user 110 or network device 102. For example, data measurements may be recorded and reported every time a measurement of interest is taken, or data may be collected on the device and occasionally uploaded in bulk to a raw measurements database 116.

In some embodiments, data acquired from network devices 102, such as, for example, cell session measurements, may be sent 114 to a raw measurements database 116 through the network operator's network (not shown). In some embodiments, data acquired from network devices 102 may be sent 114 to a raw measurements database 116 through a network for transferring data between devices (not shown). Data acquired from user devices 110, for example, user equipment session measurements, may be sent 112 to a raw measurements database 116 through a network for transferring data between devices (not shown). Raw measurements database 116 may be resident on a single device such as a server, or may be distributed amongst several interconnected devices. Raw data uploaded to the database 116 may be a single measurement, a set of single measurements, a single set of processed measurements, or multiple sets of processed measurements.

Measurements of interest may be acquired explicitly for the purpose of locating the position of a user device (for example, geo-view generation or other location-based function) or may be dual- or multiple-use measurements of network conditions based upon technical processes that are used to establish radio link transmissions, such as measurements of channel state information. For example, the position of a user's mobile device 110 may be reported as the result of a user request, or the automatic function of a mobile device application. In another example, measurement information may be collected during ongoing communication procedures such as data transmission, for instance, as channel state information used to realize a radio transmission (which in some instances may be available from the PHY-layer of system entities such as BS 102 and user equipment 110).

Various devices may be sources of measurements, such as user devices 110 or cellular network operator devices, including, for example, at a base station 102 (e.g., GSM BTS, UMTS, and LTE eNodeB). For example, network device 102 may be a Base Station (BS), wireless network access point, or any other device suited for administering radio communication over a wireless telecommunications network. In another example, user equipment 110 may include electronic devices capable of wireless network communications, such as a server, blade, PC, laptop, tablet, or mobile phone, or any device that may wirelessly exchange information with another networked device. Raw measurements, either singly or in series, may include user position (geographical location), current received signal strength (RSSI), cellular events, and WLAN measurements. Information such as signal strength collected by a receiving device 110 may be reported for one or multiple transmitting devices, for example, for serving and/or detected cells or base stations.

Information about network elements may be generated from raw measurements 116 collected from network and user equipment, but in some embodiments data may be provided and imported from network operators or third parties (not shown). Sources of geo-information include external information providers, such as street map databases from NavTech (TeleAtlas, OpenStreetMap), network devices 102-108, and user devices 110, and extracting or deriving geographic information from these measurements 116. Raw measurements 116 such as communication environment information, for example, path and location measurements from user devices 110, and measurements and data generation tools associated with network devices 102-108, may likewise be extracted or derived from external information providers.

In some embodiments where external data is imported it is combined with raw measurements 116 prior to being sent for processing, and in other embodiments external data may be processed separately from raw measurements 116 and stored in the GIS Store 136. The GIS store and service may both reside on a single device such as a server 136, or may be distributed amongst two or more interconnected devices.

Raw measurements 116 may be sent to processors to generate views for the GIS Store 136. Calculations to generate relevant geo-data for the GIS database from measurements include radio model calculations and other data assimilation techniques.

The data output by the GIS system 136 at the output interface 138, 140 is extensible, and may be used for applications wider than might be assumed from the data entering the input interface of the GIS system which are collected as raw measurements, typically from cellular networks. In certain embodiments, the GIS service stores geo-views of different types for environmental properties that have a major influence on radio propagation conditions in a cellular access network, such as spatially resolved radio coverage, spatially resolved radio path conditions, radio path properties, spatial relationships among cells, terrain information, building shapes, network demand, and other objects in the physical environment.

For example, the GIS service 136 may store map-based information for spatially resolved coverage such as path loss from antennas, land usage type for the receiver area, and other relevant parameters. In another example, the service may store environment information about terrain such as terrain map (s), altitude map (s), or location(s) of buildings, streets, or other features. In another example, the service may store information about network elements and their properties, for example locations of antennas and the radio propagation properties needed for ray tracing calculations. A geo-view may include information elements such as (i) unique identifier (e.g., a URI/URL or any unique ID) and (ii) information elements about spatially distributed transmission properties. Information elements about spatially distributed transmission properties may include information elements such as (i) location, geographic area, or cell area information (ii) a property that describes radio propagation conditions, and (iii) any other information necessary or useful for the geo-view, for example a date/time stamp, data type and/or schema identifier, which data processor(s) was used to generate the geo-view, etc. The types of data managed by the GIS service are extendable.

The GIS Service may store and provide multiple and different views or information for the same area or location, for example, radio propagation models, x-maps, geometric shapes specifying Signal-to-Interference-plus-Noise Ratio (SINR) contour lines, spatial extent of shading objects, terrain contour lines, and individual path measurements. Data processors such as geo-view generators or estimators 124-128 may update the GIS store 136 periodically, for example, on a set schedule, or when the geo-view generation is re-executed in response to a certain amount of new measurement and log data. In some embodiments, data processors will weight data so as to take new data into account and age out or discount old data. Each type of information may use a specific representation or markup language. Each representation may be defined by a schema. More than one geo-view may use the same schema, for example, one geo-view may use a generator to process raw information using one method, and the others using other methods. In an exemplary embodiment of the invention, two geo-views may use the same data format for a cell coverage description created using two different geo-view generators, one using a first method to determine the coverage description, and the other a different method. The data formats used by the GIS Store are described in more detail below.

Raw measurements data 116 may be sent to each data processor as required for the processor, for example, raw data 116 may be sent 122 to a Cell Estimator 124 on a separate schedule from when data is sent 120 to a Maps Estimator 126 or sent 118 to other processors 128. In some embodiments, raw measurements data may be bulk-processed before being sent to one, several, or all data processors. Once processing is complete, each processor will send the output data to the GIS store. Each processor may send completed output data to the GIS store intermittently, e.g., when each data point has finished processing or when a sub-set of a set of data in queue to be processed has finished processing. Each processor will send data to the store separately, and will output data in different formats, for example, a Cell Estimator 124 may send Cell Mode Parameters 134 to the GIS store 136, a Maps Estimator may send Access Maps data 132, and other processors 128 each send their data 130.

If a data processor 124-128 generates a new type of geo-view, it may assign a unique identifier to the geo-view; if a data processor updates a geo-view, it may maintain the pre-existing unique identifier or assign a new unique identifier. For example, a data processor may generate a URL or URI that reflects information in the geo-view, e.g., http://[server address]/[data processor ID]/. In some embodiments, some processors 128 may request geo-views from GIS store 136 for additional processing, and once the data is processed, send data to the GIS store 136. In some embodiments, some processors may receive both raw measurements 116 and geo-views for processing. In some embodiments, a specified subset of the raw measurements or geo-views from the GIS store 136 may be sent to a processor 124-128 for processing.

Although certain implementations of the present invention store data about the environmental properties stemming from cellular networks, such as radio propagation conditions in a cellular access network, the resolution of the information is expected to be smaller than the granularity of a traditional "cell," and the format is not tailored to the cell layout of a network or collection of networks. Rather, the information may be generated and stored based on properties of the environment, based on measurements from networks, based on the characteristics of devices, and based on data formats needed for various visualizations or types of geo-views. In certain embodiments, coverage information 140 helpful for smart network management will be sent from the GIS Store 136 to a Geo-SON application 142, which would remotely re-configure network elements 146, for example, BS 102, to optimize network efficiency. In other embodiments, other services and applications 144 may request information from the GIS 138.

Figure 2:
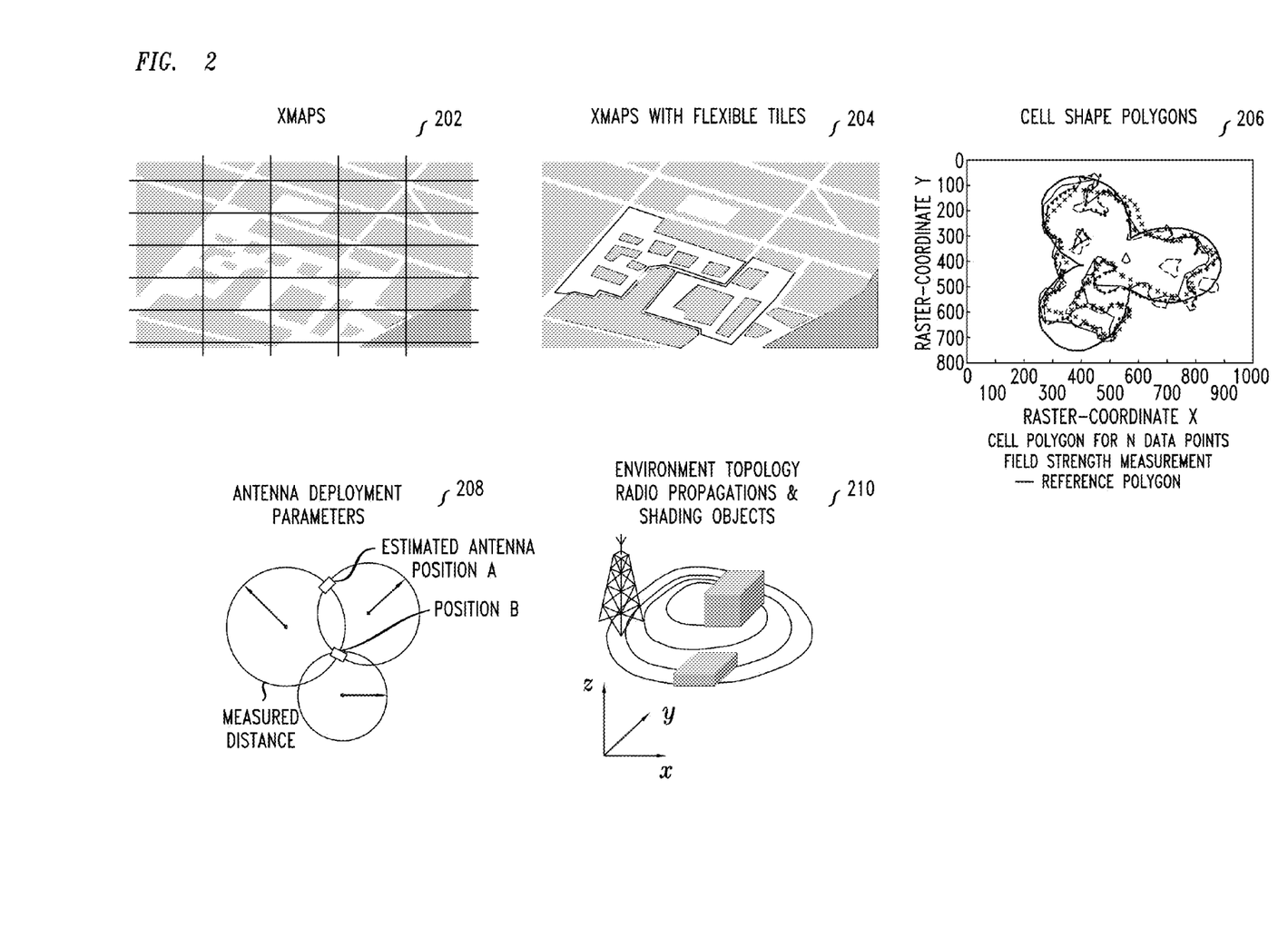
FIG. 2. illustrates exemplary visualizations of data in a Geo-Information Service.

Examples of visualizations that may represent data stored in the GIS service are shown in FIG. 2, such as xMaps 202, xMaps with flexible tiles 204, cell shape polygons 206, Antenna deployment parameters 208, or environment topology or radio propagations and shading elements 210.

Location information may include any information that can be estimated by the reporting device, such as physical position, estimated accuracy, method of detection (e.g. GPS or Wi-Fi-based location), speed, bearing, estimated distance to a fixed point, etc. Information from measurements taken from cellular network equipment may include raw or derived parameters, for example, network-based position-estimation of users based on derived parameters, such as location, speed, and walk angle; network-based user movement estimations based on channel properties, such as Doppler-Shift measurements; channel state information from ongoing users, collected at the PHY-layer entities of base stations; and statistical properties of user communications, such as rates, volume, and burstiness. Raw measurements and information derived from user devices may include, for example, GPS position, speed, walk angle, derived acceleration, acceleration information from acceleration sensors, channel state information, Received Signal Strength (RSSI), time-advance settings, and further PHY-layer information; and statistical properties of user device communications, such as rates, volume, and burstiness.

As previously noted, the data format in the GIS store is not tailored to cell layout, however, because cellular networks are typically inherently spatially distributed, i.e., the cells tessellate the area according to their spatial locations, this "real-world property" will be reflected in geo-views kept in the store, which all have a spatial component. A data representation of a geo-view typically comprises information elements or objects that describe one or more aspects together with area information for which this aspect is observed. Physical observations of the transmission conditions of a particular base station will necessarily occur in the general geographic area of the transmission range of the base station.

The GIS system is flexible in that it may be adapted during operation. New formulations to evaluate raw data or other data contained in the system may be added. New schemas may be added so that the system may store and disseminate information in forms useful for new services and other uses. Likewise, schemas may be adapted or added in order to incorporate data from new data sources.

In certain embodiments of the invention, a Geo-SON application will query a general-service Geo-Information System (GIS Service) inside an operator's network for information needed to perform network parameter optimization tasks. However, regardless of whether data is collected, processed, or maintained by a network operator, information may be collected from any communications network accessible to collecting devices, including the networks of different operators, and networks of different types, for example, cellular or Wi-Fi networks.

Likewise, in some embodiments, processed information may be provided as an information base for a Geo-SON, as a general service in a network operator's network, as a service provided by an operator accessible to customers of a network operator, or as a service provided by a third party. In some embodiments, multiple applications will query the GIS Service to access the geo-views generated from measurements and log-data of cellular networks. Applications may include non-Geo-SON network management functions or other non-network related applications that require environment information as input. Examples of network-centric applications include antenna-tilt optimization and network re-planning for adding small cells. Non-network related applications may include, for example, over-the-top applications, advertisement targeting, and city planning tools (e.g. to determine user density distributions or commuter flows).

These applications would use the geo-views generated by the GIS Service as input to realize network-centric or non-network centric purposes. Each application would require a specific geo-view or set of geo-views out of the set of all available geo-views. Interaction between geo-view generators and geo-view applications is modular in order to support access from potentially unknown applications without re-configuration of the Service every time an application is added or changed. In some embodiments of the invention, an application might be required provide authentication to access the GIS store 136. In some embodiments, access would be restricted to applications within a network or list of networks, or in another example authenticated access would be required from outside a network. In some embodiments, an access log may be maintained of for example, applications 142-144 and networks that access the store 136.

Geo-views stored in the GIS store may be de-composed into objects. Each geo-object may include position, point, or area information to geo-locate the object and further object properties that describe object parameters, for example, base station type, antenna transmit power, antenna electrical properties, building height, or terrain surface profiles. Each geo-view may be output from processing or from the store in a specific data format or markup specified by a data format description such as a document type description (DTD), XML Schema (XS), Relax NG, or any other format description. Geo-views may be updated by replacing an existing geo-view or by updating or adding elements of an existing geo-view.

Applications may request geo-views from the store individually by geo-view identifier, in sets indicated by view identifiers, or in subsets indicated by area or other spatial restrictions. Spatial indicators may include a location, a location plus vicinity, a geographic region, a transmission signature, or a semantic or textual description of a geographic region (e.g., John F. Kennedy Airport or Wrigley Field). A query may identify a particular geo-view or a sub-set of information elements that may identify a geo-view or set of geo-views. Geo-applications such as Smart Network Management applications 142 or other requesters 144 may send a query to the GIS Service 136 for a list of geo-views available from the store for a spatial indicator (e.g. location or area), and the GIS Service will return the geo-view identifiers matching the requested indicator, an indication that there are no geo-views available which match the requested indicator, or an indication that there are geo-views that match a similar or close indicator. For example, an application may query the GIS Store for geo-views matching or similar to a data element, for example, a position identifier or radio propagation condition. In one embodiment, applications may query the GIS Store for geo-views matching or in the vicinity of a network cell or a geographic location. In another embodiment, applications may query the GIS Store for geo-views indicating density during a time of day or time-of-day range. In another example, applications may query the GIS Store for data matching or similar to multiple data elements, for instance, a given location and a specific view such as schema or information type.

Applications may request information other than geo-view identifiers, for example, complete geo-views, the last time a data set was updated, a list of all geo-views available, or a list of schemas available. In some embodiments, applications may query the GIS Store for which schemas are available for a given location or area. The GIS service may return the schemas available or other information to identify the information representations available for a requested location or area. As an example, the service may return a list of schema URI or URL addresses, where the schema description is available by accessing the address.

In some embodiments, the GIS service may maintain a list of data processors, including a unique identifier for each processor, a description of the methodology the processor uses to process data and/or what data is processed, what schema data is used to output data (for example, by schema unique identifier).

Figure 3:
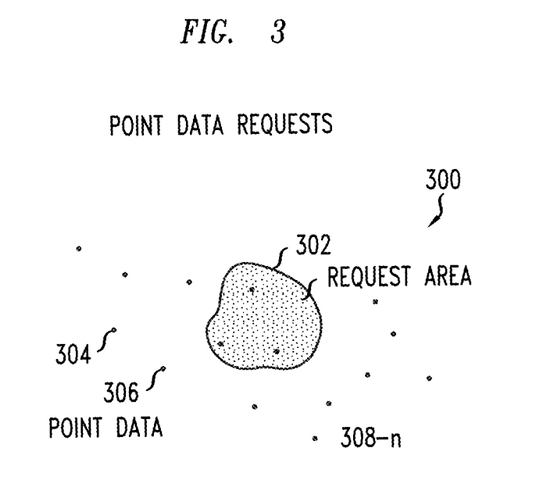
FIG. 3. illustrates exemplary visual representations of spatial indicators in a Geo-Information Service.
Figure 4:
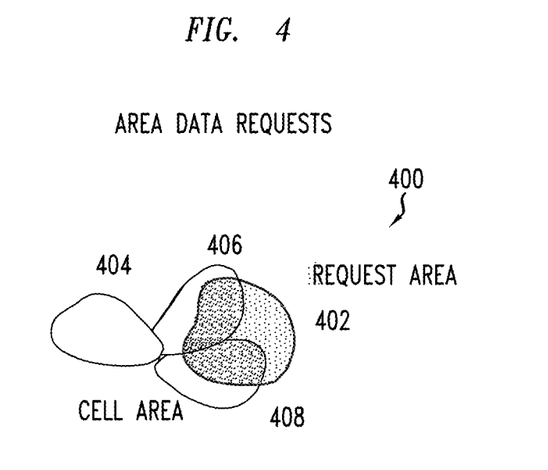
FIG. 4. illustrates exemplary visual representations of spatial indicators in a Geo-Information Service.

Various examples of visual representations of spatial indicators are shown in FIG. 3 and FIG. 4. For example, a request for a view about a location 300 may be represented by a single point, 304 or 306. In another example, an area query may select all geo-view elements inside an area 302. In other examples, a view for an area 400 may be requested by relation to an area of the transmission characteristics of a single cell, 404 or a combination area 402 of the transmission characteristics of multiple cells 406 and 408.

In certain embodiments, a view is generated according to standards, for example, data elements and data quality, required by geo-view generators and applications for geo-views. These standards may implicitly be incorporated into one or more schemas.

An interface may be provided for the GIS service so that geo-views in the store may be managed by a user. For example the geo-information service (GIS store) may support the addition and the removal of geo-views. In one embodiment, a user is authenticated and may interact with the system to view, change, add, delete, or otherwise interact with geo-views. In some embodiments, the interface may assign a unique identifier to new geo-views added by a user. In some embodiments, a user may specify an identifier for geo-views added or changed by the user. In some embodiments, the interface may verify that an identifier specified by a user is unique. In some embodiments, the interface may add an indication to any geo-view added or changed by a user. In some embodiments, the GIS service may maintain a list of geo-views deleted by users. In another embodiment, a user sends change requests with an authentication code through a service 144 connected to the system. In some embodiments, the GIS service 136 may receive a change request from a user, send an authentication request to the user, and not make changes unless the authentication code is received and verified. In one embodiment, a sub-set of geo-views within the system is managed. In one embodiment, a user may send a request to the GIS service 136 and receive a list of managed geo-views. In some embodiments, an authentication code may be required to receive a list of managed geo-views. In some embodiments, a change request may include a model identifier and a schema (e.g., Schema URI) that belongs to the model.

According to the foregoing, various exemplary embodiments provide for improving service quality and network capacity in already-deployed networks by optimizing the parameters of existing equipment. In particular these improvements may be made by applications at the network device, user device, and network management levels. Data estimators, data processing models to process raw and log data into geo-views, may be provided to support applications.

One exemplary application of geo-views stored by the GIS store 136 is analysis of spatially resolved actual radio propagation conditions in deployed networks and use of the resulting information in smart network management functions. For example, geo-relations among cells and between the sender and receiver antennas may be taken into account when optimizing network parameters in a Geo-Aware SON. Calculation methodologies for optimizing network parameters may be known from system simulations and ray-tracing calculations. Typically these types of optimizations and calculations will need data inputs at a granularity below cell size. In some embodiments, such information would be provided not on a per-SON function basis but as a general service in the operator's network.

An example of a data estimator is a cell estimator 124 that evaluates user measurements and log data to calculate geo-views of network deployment parameters such as antenna positions and antenna patterns. Another example of a data estimator may generate traffic density heat-map geo-views 212 below cell granularity by evaluating Per Call Measurement Data (PCMD). Another example of a data estimator may generate views of major shading objects 210 by extrapolating from data generated by user devices.

An application might request multiple views from a GIS service. In an example of an application that might typically be used by a network device, in order to optimize tilt angles while maintaining Key Performance Indicators (KPI), an application for a geo-aware tilt-optimizer might request 1) an x-maps view 202 (for the cells to optimize path loss from the antenna of a serving cell to potential user locations), 2) an interference graph (that indicates neighbor cells that cause the most interference), and 3) antenna locations relative to shading objects (such as buildings) 210.

In an exemplary application that may be used by a user device, a control instance for opportunistic communications on a user device may determine whether to communicate with a small or capacity cell or to defer communication with a macro cell based upon the contour lines of all small cells in the device's neighborhood and calculated intersections of the contour lines with the user device's movement trajectories.

In an exemplary application that may be used by a third-party operator, a third party application would receive from the GIS store a data set of pre-specified data and data properties according to specification documents and schema descriptions. The data may include geo-views for population density distribution, and based upon the geo-views including, for example, specific data and known data types and data quality, the application would calculate the locations with the greatest foot traffic.

In an exemplary application that may be used by a network operator, in order to identify places with weak coverage and propose additions of capacity cells, a network re-planning tool may query the GIS Service 136 for two information types for a given area, for example, request spatially resolved maps data and cell lists. In one example, the tool may request user densities in an area for a given time period and the cell coverage information for that area, for example represented as contour lines for SINR values. In one embodiment, the GIS Service 136 may be a centralized function in the data center of a network operators' network operation center (NOC). In another embodiment, the GIS service may be split amongst geographically separated data centers. In one such embodiment, data for particular geographic regions may be located in one or more data centers or nodes tasked for that region (which may or may not be located in that region).

Figure 5:
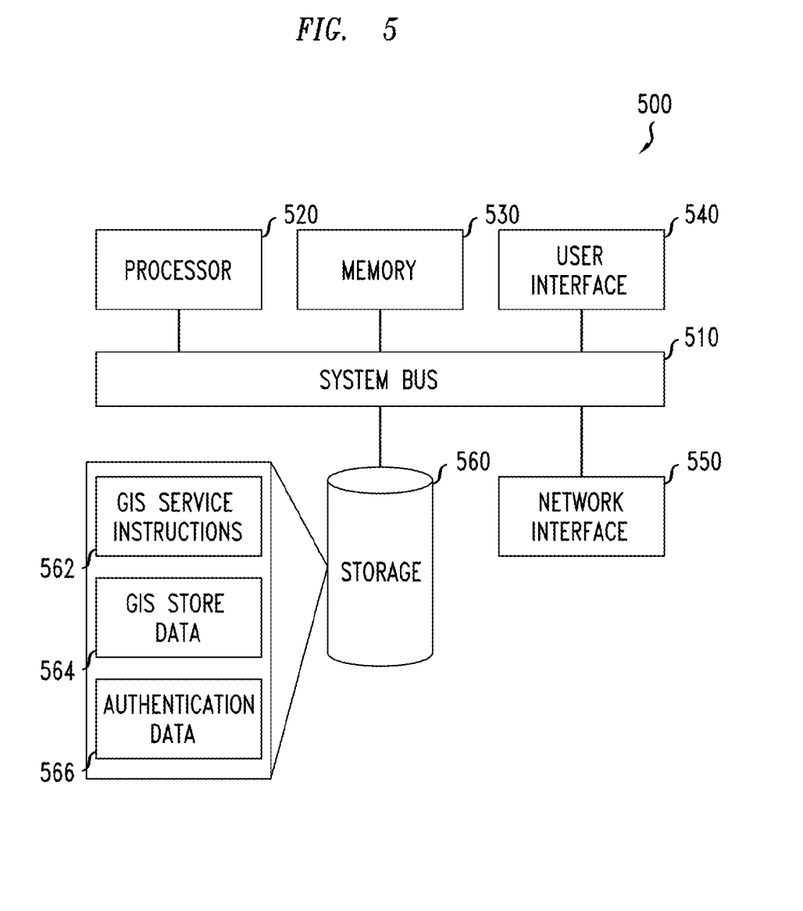
FIG. 5. illustrates an exemplary hardware diagram for an Geo-Information Service server.

FIG. 5 illustrates an exemplary hardware diagram for a GIS server 500. The exemplary GIS server 500 may correspond to the GIS server 136 of FIG. 1. As shown, the GIS server 500 includes a processor 520, memory 530, user interface 540, network interface 550, and storage 560 interconnected via one or more system buses 510. It will be understood that FIG. 5 constitutes, in some respects, an abstraction and that the actual organization of the components of the GIS server 500 may be more complex than illustrated.

The processor 520 may be any hardware device capable of executing instructions stored in memory 530 or storage 560. As such, the processor may include a microprocessor, field programmable gate array (FPGA), application-specific integrated circuit (ASIC), or other similar devices.

The memory 530 may include various memories such as, for example L1, L2, or L3 cache or system memory. As such, the memory 530 may include static random access memory (SRAM), dynamic RAM (DRAM), flash memory, read only memory (ROM), or other similar memory devices.

The user interface 540 may include one or more devices for enabling communication with a user such as an administrator. For example, the user interface 440 may include a display, a mouse, and a keyboard for receiving user commands.

The network interface 550 may include one or more devices for enabling communication with other hardware devices. For example, the network interface 550 may include a network interface card (NIC) configured to communicate according to the Ethernet protocol. Additionally, the network interface 550 may implement a TCP/IP stack for communication according to the TCP/IP protocols. Various alternative or additional hardware or configurations for the network interface 550 will be apparent.

The storage 560 may include one or more machine-readable storage media such as read-only memory (ROM), random-access memory (RAM), magnetic disk storage media, optical storage media, flash-memory devices, or similar storage media. In various embodiments, the storage 560 may store instructions for execution by the processor 520 or data upon with the processor 520 may operate. For example, the storage 560 may store GIS Service instructions 562 for performing application geo-view queries according to the concepts described herein. The storage may also store GIS Store Data 564 and Authentication Data 566 for use by the processor executing the GIS Service instructions 562.

It will be apparent that various information described as stored in the storage 560 may be additionally or alternatively stored in the memory 530. For example, the GIS Service instructions may be stored, at least partially, in memory 530 for execution by the processor 520. As another example, in embodiments wherein the GIS server 500 interfaces with an external application, the memory 530 may instead store Authentication Data 566 that have been fetched for processing. In this respect, the memory 530 may also be considered to constitute a "storage device." Various other arrangements will be apparent. Further, the memory 530 and storage 560 may both be considered to be "non-transitory machine-readable media." As used herein, the term "non-transitory" will be understood to exclude transitory signals but to include all forms of storage, including both volatile and non-volatile memories.

While the GIS server 500 is shown as including one of each described component, the various components may be duplicated in various embodiments. For example, the processor 520 may include multiple microprocessors that are configured to independently execute the methods described herein or are configured to perform steps or subroutines of the methods described herein such that the multiple processors cooperate to achieve the functionality described herein. In some embodiments, such as those wherein the GIS server 500 is implemented in a cloud computing architecture, components may be physically distributed among different devices. For example, the processor 520 may include a first microprocessor in a first data center and a second microprocessor in a second data center. Various other arrangements will be apparent.

It should be apparent from the foregoing description that various exemplary embodiments of the invention may be implemented in hardware and/or firmware. Furthermore, various exemplary embodiments may be implemented as instructions stored on a machine-readable storage medium, which may be read and executed by at least one processor to perform the operations described in detail herein. A machine-readable storage medium may include any mechanism for storing information in a form readable by a machine, such as a personal or laptop computer, a server, or other computing device. Thus, a machine-readable storage medium may include read-only memory (ROM), random-access memory (RAM), magnetic disk storage media, optical storage media, flash-memory devices, and similar storage media.

It should be appreciated by those skilled in the art that any block diagrams herein represent conceptual views of illustrative circuitry embodying the principals of the invention. Similarly, it will be appreciated that any flow charts, flow diagrams, state transition diagrams, pseudo code, and the like represent various processes which may be substantially represented in machine readable media and so executed by a computer or processor, whether or not such computer or processor is explicitly shown.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

What is claimed is:

1. A method performed by a Geo-Information System server for processing geo-information related to conditions in a cellular network, the method comprising:
   receiving, at the Geo-Information System server, a geo-view identifier;
   receiving data in a format consistent with the identified schema;
   storing the received data in a data store, wherein a plurality of different schemas are defined, applications are configured to query the Geo-Information Server for which schemas are available for a given location and the Geo-Information Server returns information used for identifying a given schema;
   sending an indication whether a geo-view identified by the geo-view identifier is available, the geo-view comprising a schema identifier, wherein a schema identified by the schema identifier describes a data format comprising location information and one or more characteristics of the conditions in the cellular network;
   where the characteristics of the conditions in the cellular network include one or more of geometric shapes specifying Signal-to-Interference-plus-Noise Ratio (SINR) contour lines, spatial extent of shading objects, and terrain contour lines;
   where the location information comprise data elements representing one or more of estimated accuracy, method of detection, speed, bearing, and estimated distance to a fixed point; and
   where a geo-view comprises data elements representing one or more of path loss from antennas, and locations of antennas.

2. The method of claim 1, further comprising:
   when the geo-view identifier is not available, receiving schema information for a new geo-view, the schema information comprising a schema identifier and data format information;
   generating an identifier for the new geo-view;
   storing the identifier for the new geo-view; and
   sending the identifier for the new geo-view.

3. The method of claim 2, where the identifier for the new geo-view is identical to the received geo-view identifier.

4. A method performed by a Geo-Information System server for processing geo-information related to conditions in a cellular network, the method comprising:
   receiving, at the Geo-Information System server, a geo-view identifier;
   sending an indication whether a geo-view identified by the geo-view identifier is available, wherein the geo-view comprises a schema identifier, wherein a schema identified by the schema identifier describes a data format comprising location information and one or more characteristics of the conditions in the cellular network;
   sending data in a format consistent with the identified schema, wherein a plurality of different schemas are defined, applications are configured to query the Geo-Information Server for which schemas are available for a given location and the Geo-Information Server returns information used for identifying a given schema;
   where the characteristics of the conditions in the cellular network include one or more of geometric shapes specifying Signal-to-Interference-plus-Noise Ratio (SINR) contour lines, spatial extent of shading objects, and terrain contour lines;
   where the location information comprise data elements representing one or more of estimated accuracy, method of detection, speed, bearing, and estimated distance to a fixed point; and
   where a geo-view comprises data elements representing one or more of path loss from antennas, and locations of antennas.

5. The method of claim 4, further comprising:
   receiving a query comprising a location indication,
   wherein the sent data comprises one or more characteristics of the conditions in the cellular network and location information consistent with the location indication.

6. The method of claim 4, further comprising:
   receiving a query comprising a location indication,
   wherein the sent data comprises an indication that there is no stored data consistent with the location indication.

7. A Geo-Information System server for processing geo-information related to conditions in a cellular network, the Geo-Information System server comprising:
   a network interface; and
   a processor in communication with the network interface, the processor being configured to:
   receive, via the network interface, a geo-view identifier;
   receive, via the network interface, data in a format consistent with the identified schema;
   store the received data in a data store, wherein a plurality of different schemas are defined, applications are configured to query the Geo-Information Server for which schemas are available for a given location and the Geo-Information Server returns information used for identifying a given schema;
   send, via the network interface, an indication whether a geo-view identified by the geo-view identifier is available, the geo-view comprising a schema identifier, wherein a schema identified by the schema identifier describes a data format comprising location information and one or more characteristics of the conditions in the cellular network;
   where the characteristics of the conditions in the cellular network include one or more of geometric shapes specifying Signal-to-Interference-plus-Noise Ratio (SINR) contour lines, spatial extent of shading objects, and terrain contour lines;
   where the location information comprise data elements representing one or more of estimated accuracy, method of detection, speed, bearing, and estimated distance to a fixed point; and
   where a geo-view comprises data elements representing one or more of path loss from antennas, and locations of antennas.

8. The Geo-Information System server of claim 7, wherein the processor is further configured to:
   when the geo-view identifier is not available, receive, via the network interface, schema information for a new geo-view, the schema information comprising a schema identifier and data format information;

generate an identifier for the new geo-view;
store the identifier for the new geo-view in a data store; and
send, via the network interface, the identifier for the new geo-view.

9. The Geo-Information System server of claim 8, wherein the identifier for the new geo-view is identical to the received geo-view identifier.

10. A Geo-Information System server for processing geo-information related to conditions in a cellular network, the Geo-Information System server comprising:
    a network interface; and
    a processor in communication with the network interface, the processor being configured to:
    receive, via the network interface, a geo-view identifier;
    send, via the network interface, an indication whether a geo-view identified by the geo-view identifier is available, wherein the geo-view comprises a schema identifier, wherein a schema identified by the schema identifier describes a data format comprising location information and one or more characteristics of the conditions in the cellular network;
    send, via the network interface, data in a format consistent with the identified schema, wherein a plurality of different schemas are defined, applications are configured to query the Geo-Information Server for which schemas are available for a given location and the Geo-Information Server returns information used for identifying a given schema;
    where the characteristics of the conditions in the cellular network include one or more of geometric shapes specifying Signal-to-Interference-plus-Noise Ratio (SINR) contour lines, spatial extent of shading objects, and terrain contour lines;
    where the location information comprise data elements representing one or more of estimated accuracy, method of detection, speed, bearing, and estimated distance to a fixed point; and
    where a geo-view comprises data elements representing one or more of path loss from antennas, and locations of antennas.

11. The Geo-Information System server of claim 10, wherein the processor is further configured to:
    receive, via the network interface, a query comprising a location indication,
    wherein the sent data comprises one or more characteristics of the conditions in the cellular network and location information consistent with the location indication.

12. The Geo-Information System server of claim 10, wherein the processor is further configured to:
    receive, via the network interface, a query comprising a location indication,
    wherein the sent data comprises an indication that there is no stored data consistent with the location indication.

* * * * *